(12) United States Patent
Nishimura et al.

(10) Patent No.: US 6,388,530 B1
(45) Date of Patent: May 14, 2002

(54) MICROWAVE AMPLIFIER IMPLEMENTED BY HETEROJUNCTION FIELD EFFECT TRANSISTORS

(75) Inventors: Takeshi Nishimura; Naotaka Iwata, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/473,924

(22) Filed: Dec. 28, 1999

(30) Foreign Application Priority Data

Dec. 28, 1998 (JP) .......................................... 10-374498

(51) Int. Cl.$^7$ ................................................ H03F 3/04
(52) U.S. Cl. ...................... 330/297; 330/296; 330/277; 330/286
(58) Field of Search .......................... 257/192; 330/277, 330/286, 296, 297

(56) References Cited

U.S. PATENT DOCUMENTS 5,081,511 A * 1/1992 Tehrani et al. ............... 257/192

FOREIGN PATENT DOCUMENTS

| JP | 62-274906 | 11/1987 | |
| JP | 62277806 | * 12/1987 | ............... 330/296 |
| JP | 2-19029 | 1/1990 | |
| JP | 3-70484 | 3/1991 | |
| JP | 5-300562 | 11/1993 | |
| JP | 7-273560 | 10/1995 | |
| JP | 8-255898 | 10/1996 | |
| JP | 9-64757 | 3/1997 | |

OTHER PUBLICATIONS

Translation of Toshio Document No. 62,0277,806.*
Savant et al. "Electronic Circuit Design an Engineering Approach" Benjamin/Cummings 1987 p. 158.*
T.B. Nishimura et al.; 44% Efficiency Power Heterojunction FET Operated at 3.5V for 1.95GHz Wide–Band CDMA Cellular Phones; pp. 32 and 33.

* cited by examiner

*Primary Examiner*—Michael B Shingleton
(74) *Attorney, Agent, or Firm*—Rosenman & Colin LLP

(57) ABSTRACT

A microwave amplifier circuit controls the output power thereof depending upon an associated transmitter of a wireless telephone, and a main amplifier transistor and switching transistors of a drain bias controlling circuit are implemented by gallium-arsenide heterojunction field effect transistors so that, even if they are integrated on a single compound semiconductor substrate, the microwave amplifier circuit achieves a high power efficiency over a wide output voltage range.

7 Claims, 4 Drawing Sheets

US 6,388,530 B1

MICROWAVE AMPLIFIER IMPLEMENTED BY HETEROJUNCTION FIELD EFFECT TRANSISTORS

FIELD OF THE INVENTION

This invention relates to a microwave circuit and, more particularly, to a microwave amplifier implemented by field effect transistors.

DESCRIPTION OF THE RELATED ART

A typical application of the microwave amplifier is a power control for a transmitter incorporated in a wireless telephone. The output power of the wireless telephone is controlled by using the microwave amplifier, and a field effect transistor is the essential circuit component of the prior art microwave amplifier circuit. The gate voltage or the drain voltage is varied for controlling the output power as described hereinbelow.

FIG. 1 shows a typical example of the amplifier circuit. An input terminal 601 and an output terminal 602 are connected to the gate electrode of a field effect transistor 611 and the drain node of the field effect transistor 611, respectively. The field effect transistor 611 serves as a main amplifier. A power source 641 is connected through a choking coil 613 to the drain node of the field effect transistor 611, and the controller 612 is connected through a resistor 663 to the gate electrode of the field effect transistor 611. The power source 641 supplies electric current through the choking coil 613 to the drain node of the field effect transistor 611 at all times. The field effect transistor 611 discharges part of the electric current through the source node thereof, and remaining electric current flows into the output terminal 602. The controller 612 varies the potential level at the gate electrode of the field effect transistor 611, and, accordingly, controls the gain of the field effect transistor 611. As a result, the field effect transistor 611 varies the electric power at the output terminal 602.

FIG. 2 shows another example of the amplifier circuit. The second prior art amplifier circuit also includes a field effect transistor 711. An input terminal 701 and an output terminal 702 are connected to the gate electrode of the field effect transistor 711 and the drain node of the field effect transistor 711, respectively. A power source 741 is connected through a dc-to-dc converter 739 and a choking coil 713 to the drain node of the field effect transistor 711, and a gate bias terminal 712 is connected through a resistor 763 to the gate electrode of the field effect transistor 711. The dc-to-dc converter 739 varies the potential level at the drain node of the field effect transistor 711 so that the field effect transistor 711 controls the electric power at the output terminal 702. The dc-to-dc converter 739 is implemented by MOS (Metal-Oxide-Semiconductor) field effect transistors, which are fabricated on a silicon substrate. On the other hand, the field effect transistor 711 is usually fabricated on a compound semiconductor. A field effect transistor with a channel region of silicon is hereinbelow referred to as "field effect silicon transistor", and a field effect transistor with a channel region of compound semiconductor is hereinbelow referred to as "field effect compound semiconductor transistor".

Yet another example of the prior art amplifier circuit is disclosed in Japanese Patent Publication of unexamined Application No. 9-64757. The third prior art amplifier circuit detects an output electric power, and changes the drain voltage at drain nodes of field effect transistors incorporated in a power amplifier between two potential levels depending upon the output electric power. The drain node is connected to a variable dc voltage circuit or a dc-to-dc converter, and the two potential levels are selectively supplied to the drain node of the field effect transistor. With the two potential levels selectively supplied to the drain node, the power amplifier is expected to offer linear input-to-output characteristics. A pulse width modulation converter is usually used for the dc-to-dc converter, and MOS field effect silicon transistors form the pulse width modulation converter. MES (Metal-Semiconductor) field effect compound semiconductor transistors form the power amplifier. However, bipolar transistors, MOS field effect silicon transistors and hetero-bipolar transistors are available for the power amplifier.

Following problems are encountered in the above-described prior art amplifier circuits. The problems inherent in the first prior art amplifier circuit are a low efficiency and a distortion. This is because of the fact that the controller 612 varies the biasing voltage at the gate electrode of the field effect transistor 611.

The problem inherent in the second prior art amplifier circuit is a low power efficiency, a difficulty in integration on a single semiconductor chip and poor response characteristics. The low efficiency, the difficulty and the poor response characteristics are derived from the dc-to-dc converter 739. As described hereinbefore, the dc-to-dc converter 739 is implemented by the field effect silicon transistors, and are low in switching speed. The second prior art amplifier circuit is expected to control the output power at a highspeed. However, the dc-to-dc converter can not respond to the high-speed power control due to the low switching speed of the field effect silicon transistors. This results in the poor response. The efficiency of the dc-to-dc converter 739 is of the order of 85 to 90 percent, and the field effect silicon transistors incorporated therein decrease the efficiency together with decrease of the power voltage. As a result, the second prior art amplifier circuit can not achieve a high power efficiency. It is difficult to integrate the field effect compound semiconductor transistor 711 and the field effect silicon transistors of the dc-to-dc converter on a single semiconductor chip. If the field effect compound semiconductor transistor is replaced with a field effect silicon transistor, a silicon substrate is shared between the field effect silicon transistor and the field effect silicon transistors of the dc-to-dc converter 739. However, the field effect silicon transistors are designed to have a wide channel in order to decrease the series resistance. This means that the field effect silicon transistors and the dc-to-dc converter 739 occupy wide real estate on the silicon substrate. For this reason, the second prior art amplifier circuit requires a large-sized silicon chip. The large-size silicon chip makes the integration difficult from the viewpoint of production cost.

A problem inherent in the third prior art amplifier circuit is high production cost. The third prior art amplifier circuit changes the drain voltage between two potential levels depending upon the detected output power. The change of the drain voltage aims at a constant power gain and, accordingly, good linearity over a wide output power range. The set drain current is made constant in a lower power operation mode for the good linearity. The output power is detected by using an output power envelope detecting circuit. The output power envelope detecting circuit is a large electric circuit, and is expensive. This results in the high production cost of the third prior art amplifier circuit.

SUMMARY OF THE INVENTION

It is therefore an important object of the present invention to provide a microwave amplifier circuit, which is high in efficiency in a low output power operation, small in distortion and easy for integration on a single semiconductor chip.

In accordance with one aspect of the present invention, there is provided a microwave amplifier circuit comprising a field effect transistor serving as a main amplifier and a drain bias controlling circuit including a power source for generating an electric power and first heterojunction field effect transistors formed of compound semiconductor and serving as switching units electrically connected between the power source and a drain node of the field effect transistor and selectively changed between on-state and off-state so as to vary a drain voltage applied to the drain node.

BRIEF DESCRIPTION OF THE DRAWINGS

The features and advantages of the microwave amplifier will be more clearly understood from the following description taken in conjunction with the accompanying drawings in which.

DESCRIPTION OF THE PREFERRED EMBODIMENTS

A microwave amplifier circuit embodying the present invention employs a gallium-arsenide heterojunction field effect transistor as a main amplifier, i.e., an amplification transistor and switching transistors for changing a voltage. The drain voltage or the gate voltage of the amplification transistor is controlled so as to achieve a high efficiency and small distortion. The gallium-arsenide is higher in electron mobility than silicon, and, accordingly, the heterojunction field effect transistors are higher in switching speed than the MOS field effect silicon transistor. A dc-to-dc converter is implemented by the heterojunction field effect transistors, and responds to a high-speed output power control.

The heterojunction field effect transistors have the structure disclosed in "Topical Workshop on Heterostructure Microelectronics for Information System Applications Abstract", pages 32–33, 1998. The heterostructure makes the on-resistance per unit gate width extremely small. For this reason, even though the gate width is narrow, the heterojunction field effect transistors achieve on-resistance to be required. The heterojunction field effect transistors are so small that a drain bias controlling circuit occupies a relatively narrow real estate. As a result, the microwave amplifier circuit according to the present invention is fabricated on a single compound semiconductor substrate.

The switching transistors and the main amplifier are connected in series to a power source, and the power efficiency $\eta 0$ of the microwave amplifier circuit is given as $\eta$ $$\eta 0 = Ron2/(Ron1+Ron2) \times \eta$$

where $\eta$ is the power efficiency of the main amplifier, Ron1 is the on-resistance of the switching transistors and Ron2 is the on-resistance of the amplification transistor. The efficiency of the drain bias controlling circuit is increased to 90 percent or more than 90 percent when Ron1 is less than ⅑, Ron2. The on-resistance Ron1 of the switching transistor is the quotient of a drain voltage at the drain node thereof divided by the drain current at the gate voltage which maximizes the drain current. On the other hand, the on-resistance Ron2 is the quotient of the power voltage divided by the drain current at the operation. When the output voltage of the drain bias controlling circuit is high, the power batteries are connected in series. On the other hand, when the output voltage is low, the power batteries are connected in parallel. Thus, the connection between the power batteries is changed depending upon the output voltage, and the service period of the power batteries is prolonged.

Figure 3:
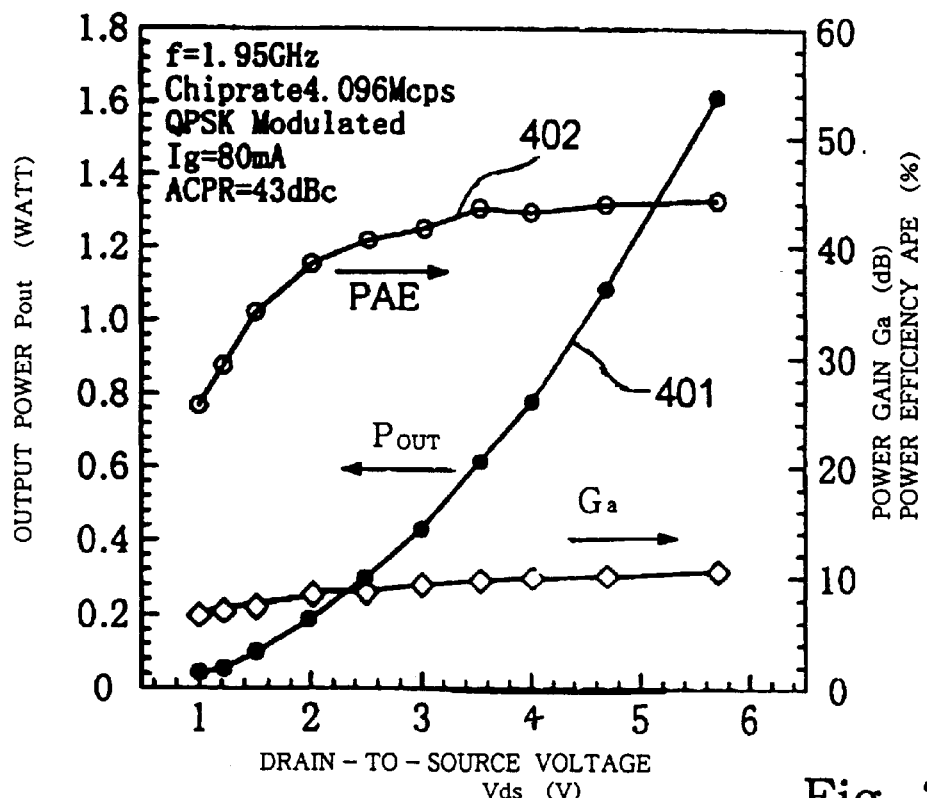
FIG. 3 is a graph showing a power voltage dependency of an output power and a power efficiency of a gallium-arsenide heterojunction field effect transistor.

FIG. 3 shows a power voltage dependency of an output voltage and a power efficiency of the gallium-arsenide heterojunction field effect transistor when the distortion standard for the broad band code division multiple access system is satisfied under the condition where the set drain current is constant as reported in the above-described paper "Topical Workshop on Heterostructure Microelectronics for Information Systems Applications Abstract", pages 32 and 33, 1998. In FIG. 3, plots 401 are indicative of the output power Pout of the gallium-arsenide heterojunction field effect transistor, and plots 402 is representative of the power efficiency APE of the gallium-arsenide heterojunction field effect transistor. As will be understood from figure 3, even if the electric power source varies the power voltage, the gallium-arsenide heterojunction field effect transistor makes the output power Pout follow it without rapid decrease of the power efficiency APE. For this reason, when the gallium arsenide heterojunction field effect transistor is used as the amplification transistor, the power efficiency is improved in a low output power range.

When the microwave amplifier circuit according to the present invention is employed in a transmitter of a wireless telephone, the gate voltage of the amplification transistor is varied in dependent on the output power of the transmitter. This makes the set bias point stable in the low output power range. As a result, the operating point is easily optimized from the viewpoint of the distortion. Thus, the amplification transistor keeps the distortion small in the low output power range, and is improved in power efficiency.

Figure 4:
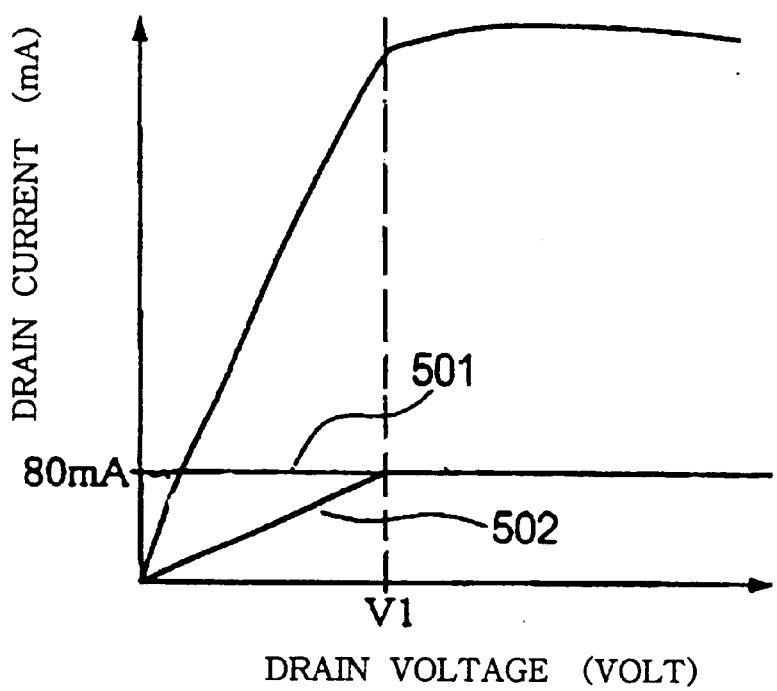
FIG. 4 is a graph showing drain voltage-to drain current characteristics of a gallium-arsenide heterojunction field effect transistor and an operating point.
Figure 1:
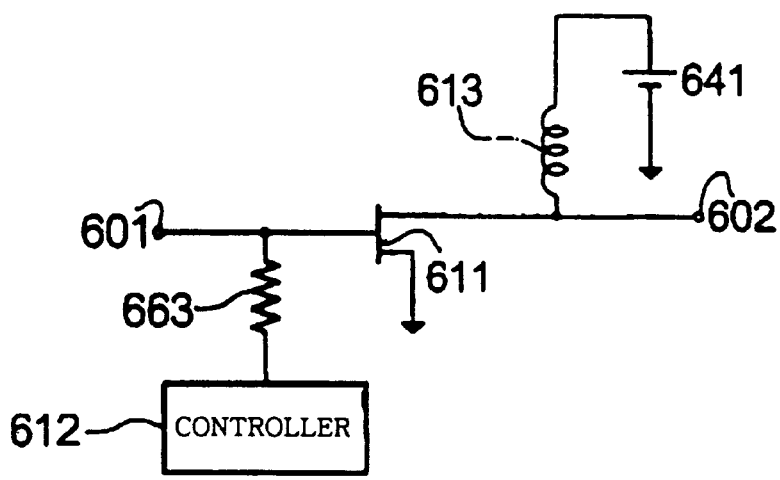
FIG. 1 is a circuit diagram showing the circuit configuration of the first prior art microwave amplifier.
Figure 2:
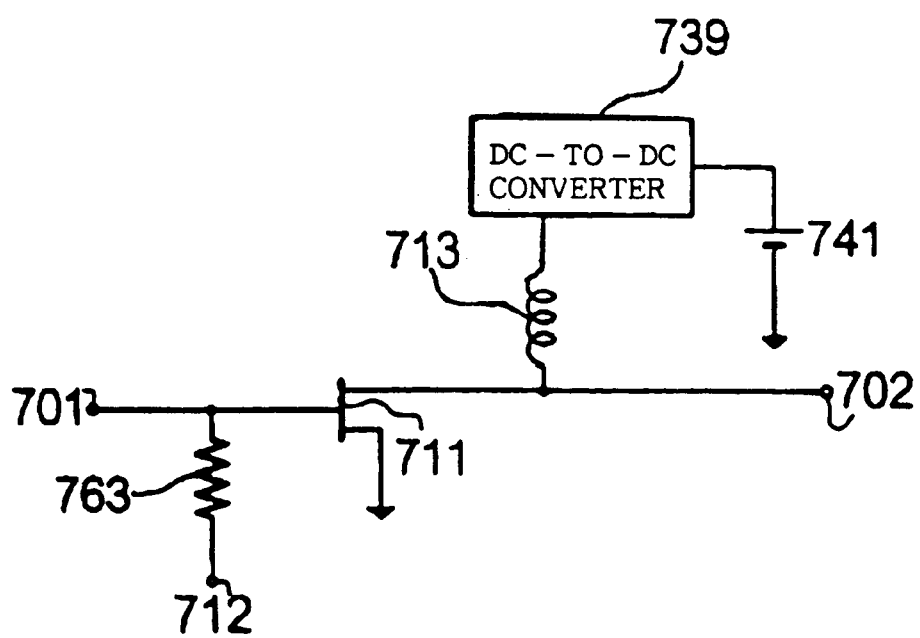
FIG. 2 is a circuit diagram showing the circuit configuration of the second prior art microwave amplifier.

FIG. 4 shows drain voltage-to-drain current characteristics of the gallium-arsenide heterojunction field effect transistor serving as the amplification transistor. As indicated by plots, the gallium-arsenide heterojunction field effect transistor increases the drain current together with the drain voltage until V1, and keeps it constant thereafter. In a microwave amplifier circuit according to the present invention, a voltage divider is connected to the gate electrode of the gallium-arsenide heterojunction field effect transistor, and a diode is inserted between a gate bias controlling circuit and the voltage divider. The forward bias voltage of the diode is designed to cause the diode to turn on when the drain voltage is equal to or less than V1. The gate bias voltage is increased, and keeps the operating point constant. If the diode and the gate bias controlling circuit are not incorporated in the microwave amplifier circuit, the operating point is varied together with the drain voltage as indicated by plots 502. However, the diode makes the gallium-arsenide heterojunction field effect transistor keep the operating point constant as indicated by plots 501.

First Embodiment

Figure 5:
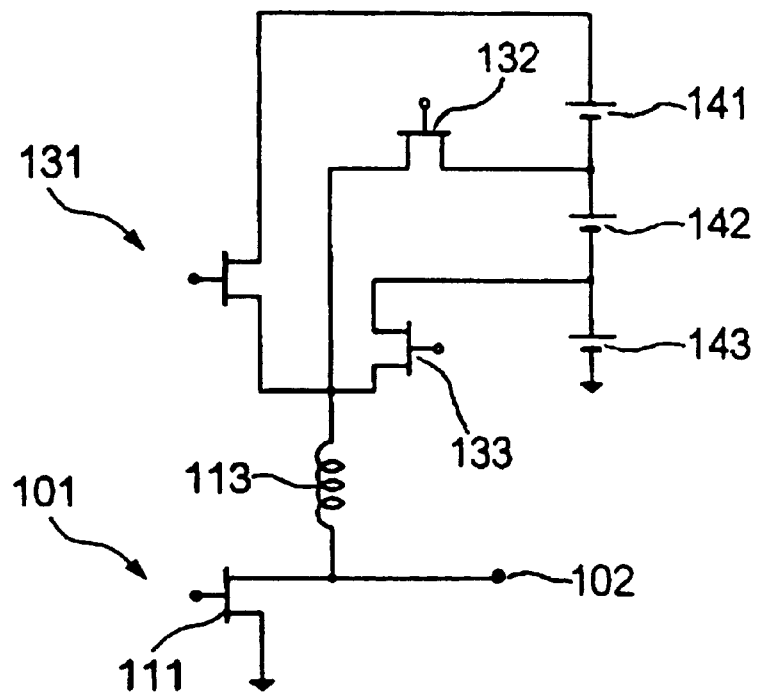
FIG. 5 is a circuit diagram showing the circuit configuration of a microwave amplifier circuit according to the present invention.

Turning to FIG. 5 of the drawings, a microwave amplifier circuit embodying the present invention comprises a main amplifier, a choking coil 113 and a drain bias voltage controlling circuit. The main amplifier is implemented by an amplification transistor 111, and the drain node of which is connected through the choking coil 113 to the drain bias voltage controlling circuit. An output terminal 102 is connected to the drain node of the amplification transistor 111. A gallium-arsenide heterojunction field effect transistor serves as the amplification transistor 111, and the gate width is 25.6 millimeters.

The drain bias controlling circuit includes three switching transistors 131/132/133 and three nickel-cadmium cells 141/142/143. Gallium-arsenide heterojunction field effect transistors serve as the switching transistors 131/132/133, respectively. Thus, all the field effect transistors 111 and 131/132/133 are of the gallium-arsenide heterojunction field effect transistor, and are integrated on a single compound semiconductor substrate. Each of the nickelcadmium cells 141/142/143 generates 1.2 volt.

The nickel-cadmium cells 141/142/143 are connected in series to the drain node of the switching transistor 131, and the source node of the switching transistor 131 is connected to the choking coil 113. The switching transistor 132 is connected between the positive electrode of the nickel-cadmium cell 142 and the choking coil 113, and the switching transistor 133 is connected between the positive electrode of the nickel-cadmium cell 143 and the choking coil 113.

A control signal is supplied to the gate electrodes of the switching transistors 131/132/133, and causes the switching transistors 131/132/133 to selectively turn on. When the control signal changes only the gate electrode of the switching transistor 131 to an active level, the switching transistor 131 turns on, and the other switching transistors 132/133 are turned off. As a result, the amplification transistor 111 is applied with 3.6 volts. When the control signal changes only the gate electrode of the switching transistor 132 to the active level, the switching transistor 132 turns on, and the other switching transistors 131/133 are turned off. As a result, the amplification transistor 111 is applied with 2.4 volts. When the control signal changes only the gate electrode of the switching transistor 133 to the active level, the switching transistor 133 turns on, and the other switching transistors 131/132 are turned off. As a result, the amplification transistor 111 is applied with 1.2 volt.

The present inventors evaluated the microwave amplifier circuit. The main amplifier 111 satisfied the distortion standard for the broad band code division multiple access system. When the operating point was adjusted to 3.6 volts, the output power was 0.6 watt, and the power efficiency was 46 percent. The present inventors changed the operating point to 2.4 volts, and measured the output power and the power efficiency. The output power was 0.3 watt, and the power efficiency was 41 percent. When the present inventors measured the output power and the power efficiency at 1.2 volt, the output power and the power efficiency were 0.06 watt and 29 percent, respectively.

When the operating point was adjusted to 3.6 volts, 2.4 volts and 1.2 volt, the on-resistance of the main amplifier 111 was 8.9 ohms, 8.4 ohms and 7.1 ohms. On the other hand, the on-resistance of each switching transistor 131/132/133 was 1.4 ohms per unit gate width of 1 millimeter. The switching transistors 131/132/133 were designed to be 1.8 millimeter in gate width, and the on-resistance of those switching transistors 131/132/133 was decreased to 0.8 ohm. Thus, the on-resistance of the switching transistors 131/132/133 was a ninth of the on-resistance of the main amplifier 111. Each of the switching transistors 131/132/133 merely occupied a narrow real estate, and the total occupation area of the switching transistors 131 to 133 was only 21 percent of the occupation area of the main amplifier 111.

Finally, the present inventors calculated the power efficiency of the microwave amplifier circuit. When the operating point was adjusted to 3.6 volts, 2.4 volts and 1.2 volt, the output power was 0.6 watt, 0.3 watt and 0.05 watt, respectively, and the power efficiency was 43 percent, 38 percent and 27 percent, respectively.

The output power of the gallium-arsenide heterojunction field effect transistor is proportional to the second power of the power voltage. As described hereinbefore, the drain bias controlling circuit shifts the drain voltage between 3.6 volts, 2.4 volts and 1.2 volt. As a result, the microwave amplifier circuit controls the output power within 10 dB, and achieves the high power efficiency in the output power range.

As will be understood from the foregoing description, the microwave amplifier circuit achieves the high power efficiency in the low output power range without serious distortion, and the manufacturer easily integrates the circuit components on a single semiconductor substrate.

Second Embodiment

Figure 6:
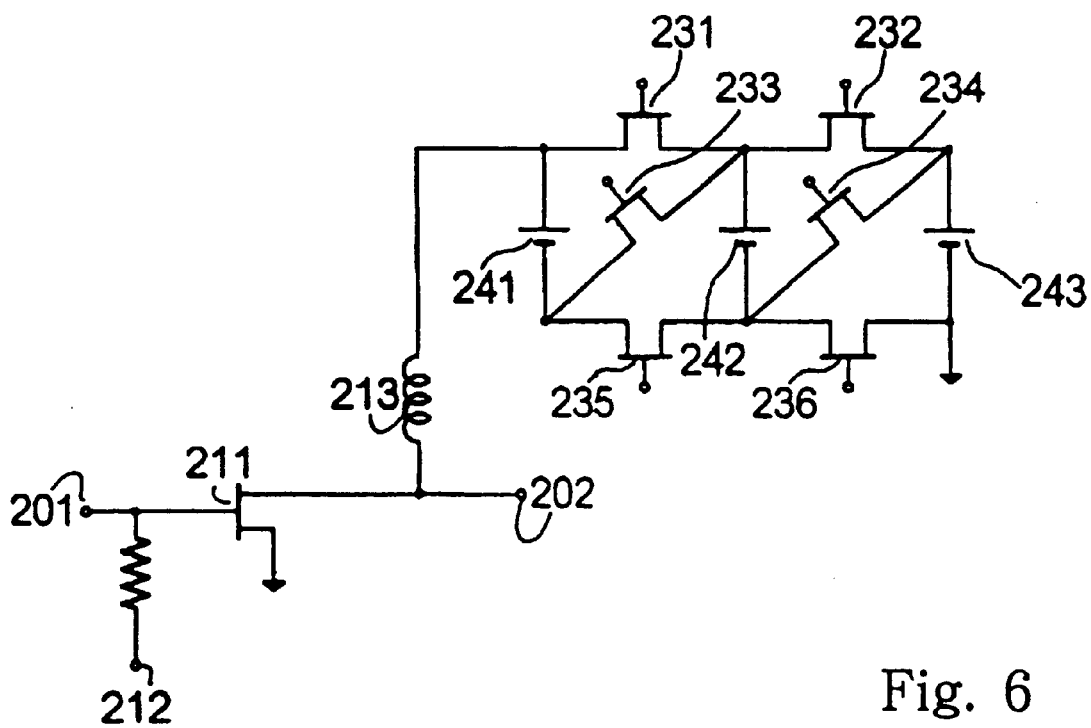
FIG. 6 is a circuit diagram showing the circuit configuration of another microwave amplifier circuit according to the present invention.

Turning to FIG. 6 of the drawings, another microwave amplifier circuit embodying the present invention also comprises a main amplifier 211, a drain voltage controlling circuit and a choking coil 213. The main amplifier 211 is implemented by a high-speed gallium-arsenide heterojunction field effect transistor. The gate of the gallium-arsenide heterojunction field effect transistor is 25.6 millimeters in width. The drain node of the main amplifier 211 is connected through the choking coil 213 to the drain voltage controlling circuit.

The drain voltage controlling circuit includes six switching transistors 231/232/233/234/235/236 and three nickel-cadmium cells 241/242/243. The nickel-cadmium cell 241 has a positive electrode, which is directly connected to the choking coil 213. The switching transistors 231 and 232 are connected between the positive electrodes of the nickel-cadmium cells 241/242 and between the positive electrodes of the nickel-cadmium cells 242/243, respectively. On the other hand, the switching transistors 233/234 are connected between the negative electrode of the nickel-cadmium cell 241 and the positive electrode of the nickel-cadmium cell 242 and between the negative electrode of the nickel-cadmium cell 242 and the positive electrode of the nickel-cadmium cell 243, respectively. The remaining switching transistors 235/236 are connected between the negative electrodes of the nickel-cadmium cells 241/242 and between the negative electrodes of the nickel-cadmium cells 242/243, respectively. The switching transistors 231 to 236 are implemented by the gallium-arsenide heterojunction field effect transistors, respectively. Each of the nickel-cadmium cells 241/242/243 generates 1.2 volt.

Though not shown in FIG. 6, a controlling signal is supplied to the gate electrodes of the switching transistors 231 to 236, and causes the switching transistors 231 to 236 to selectively turn on. When the control signal permits only the switching transistors 233/234 to turn on, the nickelcadmium cells 241/42/243 are connected in series, and the drain node of the main amplifier 211 is applied with 3.6 volts.

When the control signal causes only the switching transistors 233/232/236 to turn on, the nickel-cadmium cell 242 is connected in parallel to the nickel-cadmium cell 243, and the nickel-cadmium cells 242/243 are connected in series to the nickel-cadmium cell 241. As a result, the drain voltage of the main amplifier 211 is changed to 2.4 volts.

When the control signal causes only the switching transistors 231/232/235/236 to turn on, the nickel-cadmium cells 241/242/243 are connected in parallel, and the drain voltage of the main amplifier 211 is decreased to 1.2 volt.

The present inventors evaluated the microwave amplifier circuit implementing the second embodiment. The main amplifier 211 satisfied the distortion standard for the broad band code division multiple access system. When the operating point was adjusted to 3.6 volts, the output power was 0.6 watt, and the power efficiency was 46 percent. The present inventors changed the operating point to 2.4 volts, and measured the output power and the power efficiency. The output power was 0.3 watt, and the power efficiency was 41 percent. When the present inventors measured the output power and the power efficiency at 1.2 volt, the output power and the power efficiency were 0.06 watt and 29 percent, respectively.

When the operating point was adjusted to 3.6 volts, 2.4 volts and 1.2 volt, the on-resistance of the main amplifier 211 was 8.9 ohms, 8.4 ohms and 7.1 ohms, respectively. On the other hand, the on-resistance of each switching transistor 231/232/233/234/235/236 was 1.4 ohm per unit gate width of 1 millimeter. The switching transistors 231/232/233/234/235/236 were designed to be 1.8 millimeter in gate width, and the on-resistance of those switching transistors 231/232/233/234/235/236 was decreased to 0.8 ohm. Thus, the on-resistance of the switching transistors 231/232/233/234/235/236 was a ninth of the on-resistance of the main amplifier 211. Each of the switching transistors 231/232/233/234/235/236 merely occupied a narrow real estate, and the total occupation area of the switching transistors 231 to 236 was only 42 percent of the occupation area of the main amplifier 211.

Finally, the present inventors calculated the power efficiency of the microwave amplifier circuit implementing the second embodiment. When the operating point was adjusted to 3.6 volts, 2.4 volts and 1.2 volt, the output power was 0.6 watt, 0.3 watt and 0.06 watt, respectively, and the power efficiency was 43 percent, 38 percent and 27 percent, respectively.

The output power of the gallium-arsenide heterojunction field effect transistor is proportional to the second power of the power voltage. As described hereinbefore, the drain bias controlling circuit shifts the drain voltage between 3.6 volts, 2.4 volts and 1.2 volt. As a result, the microwave amplifier circuit controls the output power within 10 dB, and achieves the high power efficiency in the output power range. In this instance, the nickel-cadmium cells 242/243 are connected in parallel to the nickel cadmium cell 241, and the operating time at 2.4 volts is twice as long as that at 3.6 volts. When the operating point is changed to 1.2 volt, the nickel-cadmium cells 241/242/243 are connected in parallel to the choking coil 213, and the operating time at 1.2 volt is three times longer than that at 3.6 volts.

Third Embodiment

Figure 7:
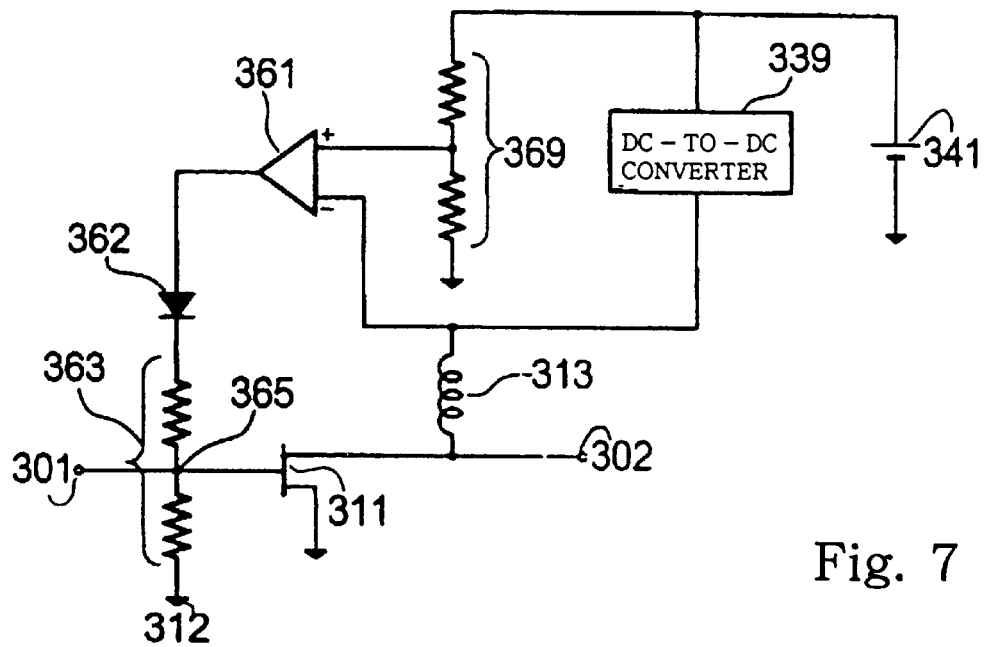
FIG. 7 is a circuit diagram showing the circuit configuration of yet another microwave amplifier circuit according to the present invention.

Turning to FIG. 7 of the drawings, yet another microwave amplifier circuit embodying the present invention comprises a main amplifier 311, a drain bias controlling circuit, a gate bias circuit and a gate bias controlling circuit. The main amplifier 311 is implemented by a gallium-arsenide heterojunction field effect transistor, the drain node of which is connected to the choking coil 313 and an output terminal 302.

The drain bias controlling circuit includes a dc-to-dc converter 339 and an electric power source 341. The switching transistors of the dc-to-dc converter 339 are also implemented by gallium-arsenide heterojunction field effect transistors. The electric power source 341 supplies electric power to the dc-to-dc converter 339 and the gate bias controlling circuit, and the dc-to-dc converter 339 is connected through the choking coil 313 to the drain node of the main amplifier 311.

The gate bias circuit includes a diode 362 and a voltage divider 363, and is connected between the gate bias controlling circuit and a gate bias terminal 312. An input terminal 301 is connected through a gate bias node 365 of the voltage divider 363 to the gate electrode of the main amplifier 311.

The gate bias controlling circuit includes a voltage comparator 361 and a voltage divider 369. The voltage divider 369 is connected to the electric power source 341, and steps down the electric power to 1.3 volt. The output voltage of the voltage divider 369 serves as a reference voltage. The voltage divider 369 supplies the reference voltage of 1.3 volt to one of the input nodes of the voltage comparator 361. The other input node of the voltage comparator 361 is connected to the output node of the dc-to-dc converter 339. The voltage comparator 361 compares the output voltage of the dc-to-dc converter 339 with the reference voltage to see whether or not output voltage of the dc-to-dc converter 339 is decreased to V1 (see FIG. 4). In this instance, V1 is equal to 1.2 volt. When the output voltage of the dc-to-dc converter 339 is decreased to or less than 1.2 volt, the comparator 361 supplies 0.1 volt to the diode 362. The gate bias terminal 312 is applied with −0.6 volt, and the potential difference exceeds the forward bias voltage or the turn-on voltage of the diode 362. Then, current starts to flow into the voltage divider 363. Thus, the gate bias controlling circuit shifts the gate potential at the gate bias node 365 to the positive side under the condition that the drain bias controlling circuit lowers the output voltage thereof.

The gate potential is varied in dependent on the output voltage of the dc-to-dc converter 339. This feature is desirable for the microwave amplifier circuit, because the gate bias controlling circuit and the gate bias circuit keep the set drain current at 80 milliampere under the drain voltage V1 as indicated by plots 501 (see FIG. 4). If the gate bias circuit and the gate bias controlling circuit are eliminated from the microwave amplifier circuit implementing the third embodiment, the set drain current is decreased under V1 as indicated by plots 502. The set drain current of 80 milliampere is optimum from the viewpoint of the minimum distortion, and the gate bias circuit and the gate bias controlling circuit are desirable for minimizing the distortion.

The present inventors evaluated the microwave amplifier circuit shown in FIG. 7. The microwave amplifier circuit satisfied the distortion standard. When the operating point was adjusted to 1.2 volt, the main amplifier 311 achieved the output power of 0.06 watt and the power efficiency of 29 percent. When the operating point was changed to 1.0 volt, the main amplifier 311 achieved the output power of 0.04 watt and the power efficiency of 25 percent. Thus, the microwave amplifier circuit implementing the third embodiment was improved in power efficiency without serious distortion in the low output power range.

As will be appreciated from the foregoing description, the microwave amplifier circuit according to the present invention is equipped with the drain bias controlling circuit implemented by the compound semiconductor field effect transistors. The compound semiconductor field effect transistors are so small in on-resistance per unit width of the gate electrode that they do not occupy a wide real estate on the compound semiconductor chip. For this reason, the manufacturer can integrate the drain bias controlling circuit on the compound semiconductor chip together with the compound semiconductor field effect transistor serving as the main amplifier. Moreover, the microwave amplifier circuit according to the present invention achieves a high power efficiency over output voltage range of 10 dB.

In the second embodiment, the voltaic cells are changed between serial connection and parallel connection depending upon the drain voltage to be required. As a result, while the transmitter is operating in a low output power range, the electric power is saved, and the operating time is prolonged.

In the third embodiment, when the drain voltage is lowered under V1, the gate bias voltage is increased so as to keep the set drain current constant. As a result, the main amplifier operates at the optimum point at all times, and the distortion is minimized.

Although particular embodiments of the present invention have been shown and described, it will be apparent to those skilled in the art that various changes and modifications may be made without departing from the spirit and scope of the present invention. For example, the nickel-cadmium (Ni—Cd) cells may be replaced with Ni—MH cells.

What is claimed is:

1. A microwave amplifier circuit comprising
   a field effect transistor serving as a main amplifier,
   a drain bias controlling circuit including
      a power source for generating an electric power and
      a de-to-dc converter electrically connected between said power source and a drain node of said field effect transistor so as to vary a drain voltage applied to said drain node,
   a gate bias circuit connected to a gate electrode of said field effect transistor and a gate bias terminal where a gate bias voltage is applied, and
   a gate bias controlling circuit connected between said power source and said gate bias circuit and supplying an electric current to said gate bias circuit so as to keep a drain current at said drain node constant even when said drain voltage is lowered under a critical value.

2. The microwave amplifier circuit as set forth in claim 1, in which said power source has plural batteries.

3. The microwave amplifier circuit as set forth in claim 2, in which each of said plural batteries is selected from the group consisting of a Ni—Cd cell and a Ni—MH cell.

4. The microwave amplifier circuit as set forth in claim 3, in which said power source includes at least three Ni—Cd cells or at least three Ni—MH cells.

5. The microwave amplifier circuit as set forth in claim 1, in which said field effect transistor is a heterojunction field effect transistor formed of a compound semiconductor.

6. The microwave amplifier circuit as set forth in claim 1, in which said gate bias circuit includes a first voltage divider having a gate bias node between resistive elements and a diode connected to one of said resistive elements, and said gate bias controlling circuit includes a second voltage divider connected to said power source and generating a reference voltage and a comparator having a first input node supplied with said reference voltage and a second input node connected to an output node of said drain bias controlling circuit and an output node connected to said diode and comparing said drain voltage with said reference voltage for supplementing said electric current through said diode to said one of said resistive elements.

7. The microwave amplifier circuit as set forth in claim 6, in which said drain current is adjusted to a value at which a distortion is small.

* * * * *